US012648415B2

(12) United States Patent
Liu et al.

(10) Patent No.: US 12,648,415 B2
(45) Date of Patent: Jun. 2, 2026

(54) METHOD FOR REDUCING WAFER EDGE DEFECTS

(71) Applicant: Winbond Electronics Corp., Taichung City (TW)

(72) Inventors: Cheng-Hsiang Liu, Taichung City (TW); Kao-Tsair Tsai, Taichung City (TW)

(73) Assignee: WINBOND ELECTRONICS CORP., Taichung City (TW)

( * ) Notice: Subject to any disclaimer, the term of this patent is extended or adjusted under 35 U.S.C. 154(b) by 434 days.

(21) Appl. No.: 18/476,987

(22) Filed: Sep. 28, 2023

(65) Prior Publication Data

US 2025/0054807 A1 Feb. 13, 2025

(30) Foreign Application Priority Data

Aug. 10, 2023 (TW) .................................. 112130070

(51) Int. Cl.
H01L 21/762 (2006.01)
H01L 21/308 (2006.01)
H01L 21/3105 (2006.01)

(52) U.S. Cl.
CPC .... H01L 21/76224 (2013.01); H01L 21/3086 (2013.01); H01L 21/31053 (2013.01)

(58) Field of Classification Search
CPC ............. H01L 21/76224; H01L 21/762; H01L 21/3086; H01L 21/308; H01L 21/31053; H01L 21/3105; H01L 21/0274; G03F 7/70425; G03F 7/00; G03F 7/70733; G03F 7/70916
See application file for complete search history.

(56) References Cited

U.S. PATENT DOCUMENTS

| | | | |
|---|---|---|---|
| 10,181,401 B1 * | 1/2019 | Shih ...................... | H10D 84/038 |
| 11,605,538 B2 * | 3/2023 | Zi ............................. | G03F 7/038 |
| 12,027,369 B2 * | 7/2024 | Wan ......................... | H10B 12/09 |
| 2009/0297986 A1 | 12/2009 | Moritoki | |
| 2020/0135451 A1 * | 4/2020 | Zi ......................... | H01L 21/0274 |
| 2022/0077136 A1 * | 3/2022 | Kuo ................... | H01L 21/0274 |
| 2023/0012863 A1 * | 1/2023 | Wan ......................... | H10B 12/09 |

FOREIGN PATENT DOCUMENTS

| | | |
|---|---|---|
| CN | 101877306 A | 11/2010 |
| CN | 102856168 B | 10/2015 |

* cited by examiner

*Primary Examiner* — Nikolay K Yushin
(74) *Attorney, Agent, or Firm* — Birch, Stewart, Kolasch & Birch, LLP

(57) ABSTRACT

A method for reducing wafer edge defects is provided. The method includes providing a wafer with a central region and an edge region, forming a hard mask layer on the wafer, forming a spacer pattern on the hard mask layer, forming a photoresist layer covering the spacer pattern, performing a wafer edge treatment process on the photoresist layer to form an annular photoresist pattern, using the annular photoresist pattern as an etching mask, and sequentially transferring the exposed spacer pattern to the hard mask layer and the wafer to form a plurality of trenches in the wafer.

18 Claims, 10 Drawing Sheets

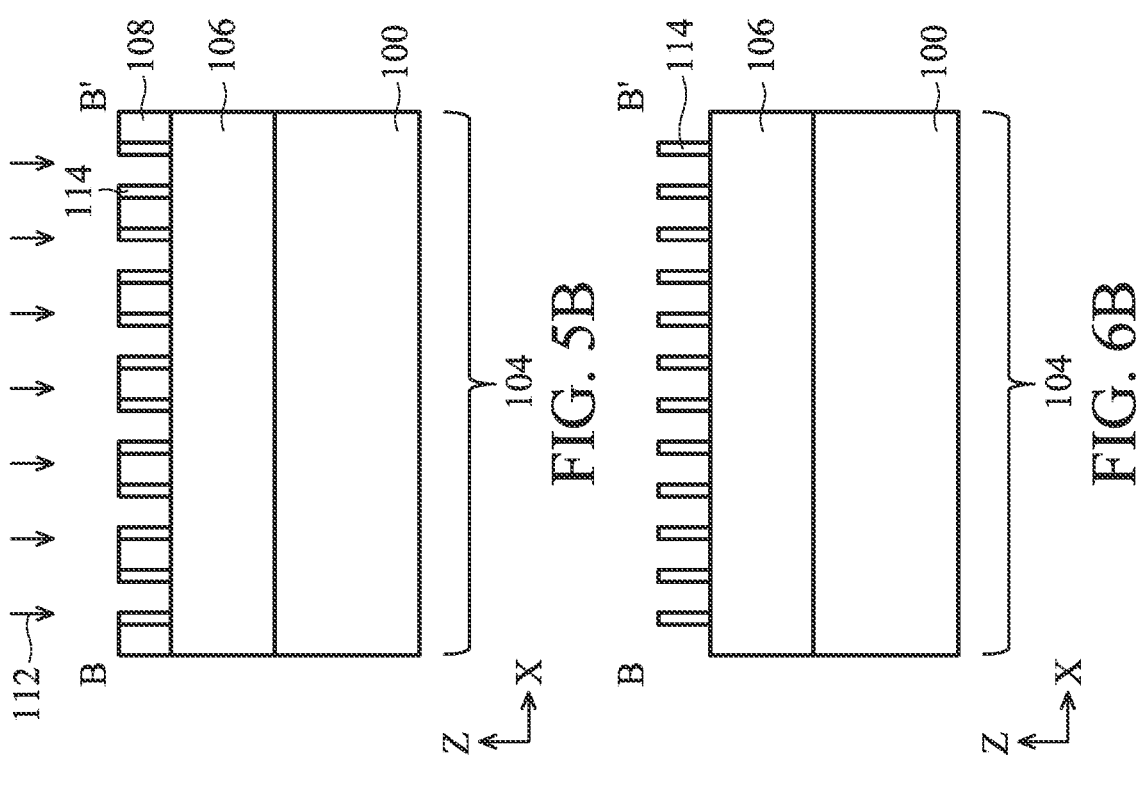
FIG. 5A
FIG. 5B
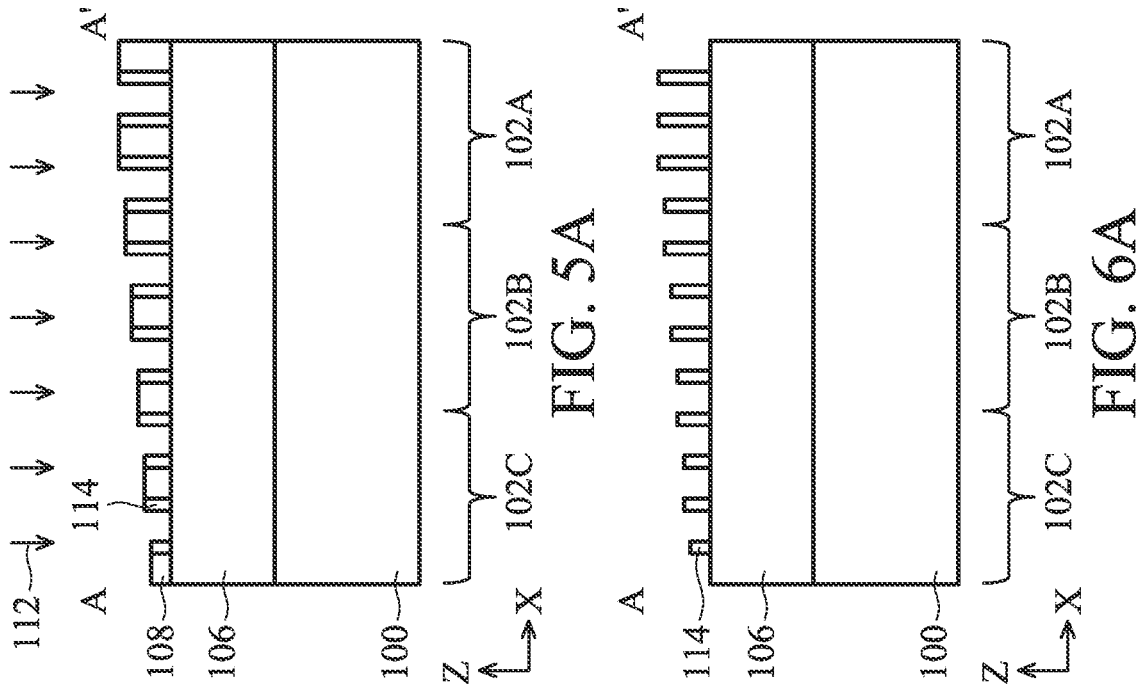
FIG. 6A
FIG. 6B

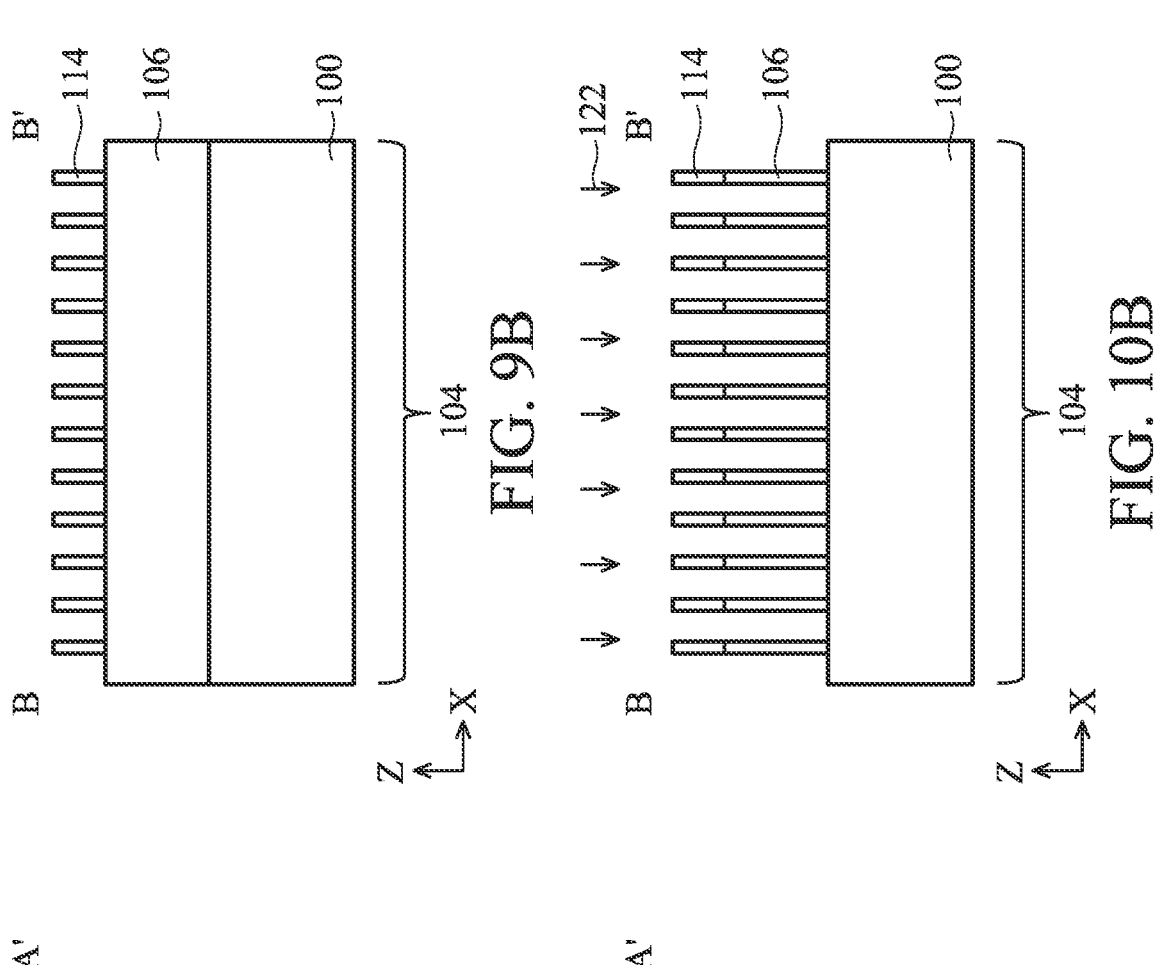
FIG. 9A
FIG. 9B
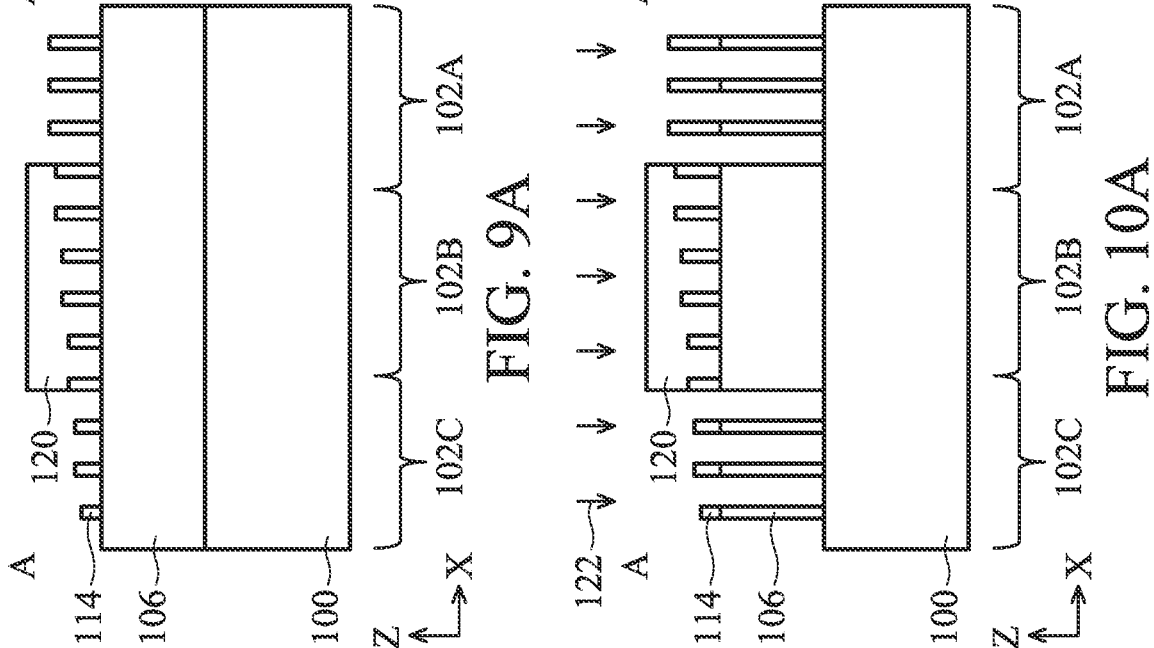
FIG. 10A
FIG. 10B

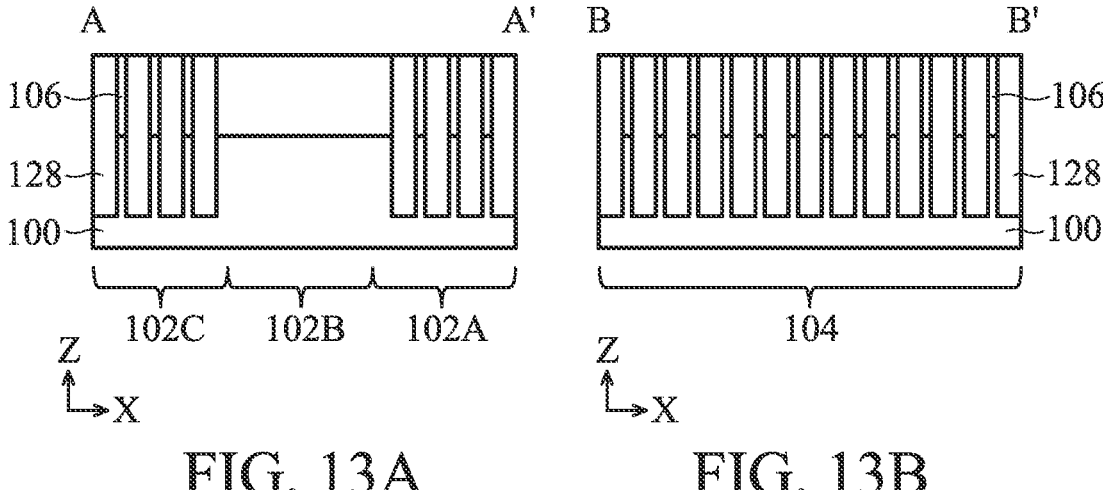
FIG. 13A FIG. 13B
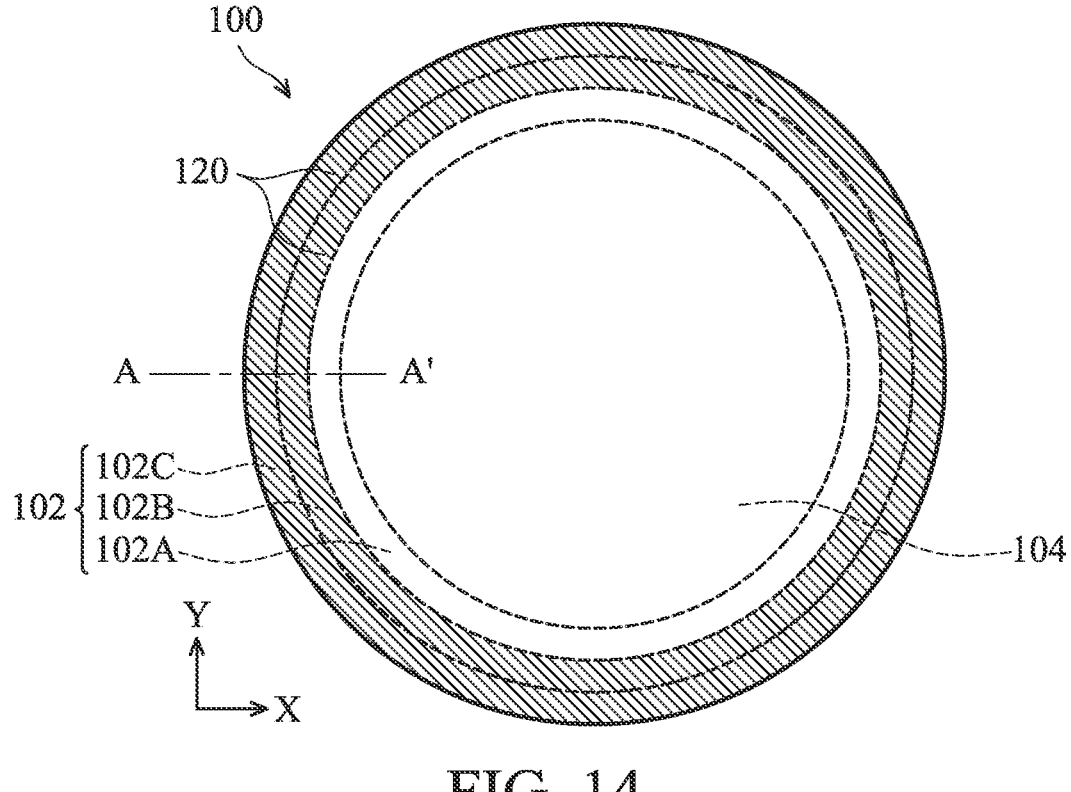
FIG. 14

METHOD FOR REDUCING WAFER EDGE DEFECTS

CROSS REFERENCE TO RELATED APPLICATIONS

This application claims priority of Taiwan Patent Application No. 112130070 filed on Aug. 10, 2023, the entirety of which is incorporated by reference herein.

BACKGROUND OF THE INVENTION

Field of the Invention

The present disclosure relates to a semiconductor process, and in particular to method for reducing wafer edge defects.

Description of the Related Art

In the semiconductor manufacturing process, the wafer edge is usually not fully exposed due to limitations in the lithography process technology, and therefore the wafer edge is an invalid wafer region. In addition, wafer edges can also be affected by the uniformity of film deposition, uniformity of photoresist coating, exposure defocus, and etch loading. This makes the wafer edges a source of defects. Therefore, during the subsequent deposition or etching process, defects such as fragments or particles may be generated and released into the central region of the wafer, resulting in a lower product yield.

The lithography process has entered the generation of pattern disassembly, which means that the patterns in the array region and the peripheral region are exposed individually. In general, in order to prevent wafer edges from becoming a source of defects and to maintain the consistency of chemical mechanical polishing, an edge treatment process such as edge bead removal (EBR) or wafer edge exposure (WEE) is usually performed to remove or retain the photoresist in the edge region and reduce the effect of defects caused by incomplete exposure of the wafer edges. However, this may result in a ring of overlapping or non-overlapping portions at the junction of the array region and the peripheral region, which may cause either the film or the pattern to form an undesired height difference, as well as producing a large number of defects. The height difference may not be overcome in the planarization process (e.g., a chemical mechanical polishing treatment).

BRIEF SUMMARY OF THE INVENTION

An embodiment of the present disclosure provides a method for reducing edge defects, including: providing a wafer with a central region and an edge region, wherein the edge region includes a first edge region surrounding the central region, a second edge region surrounding the first edge region, and a third edge region surrounding the second edge region; forming a hard mask layer on the wafer; forming a spacer pattern on the hard mask layer; forming a photoresist layer covering the spacer pattern; performing a wafer edge treatment process on the photoresist layer to form an annular photoresist pattern, wherein the annular photoresist pattern selectively covers the spacer pattern located in at least one of the first edge region, the second edge region, and the third edge region and exposes the spacer pattern in the central region; and using the annular photoresist pattern as an etching mask, sequentially transferring the exposed spacer pattern to the hard mask layer and the wafer to form a plurality of trenches in the wafer.

BRIEF DESCRIPTION OF THE DRAWINGS

FIGS. 2A, 2B, 3A, 3B, 4A, 4B, 5A, 5B, 6A, 6B, 7A, and 7B illustrate cross-sectional views of the wafer in various process stages according to the embodiment of the present disclosure;

FIGS. 9A, 9B, 10A, 10B, 11A, 11B, 12A, 12B, 13A, and 13B illustrate cross-sectional views of the wafer in various process stages according to an embodiment of the present disclosure;

FIG. 14 illustrates a top view of the wafer according to another embodiment of the present disclosure;

DETAILED DESCRIPTION OF THE INVENTION

The present disclosure provides methods of combining an additional wafer edge treatment process at the lithography process step, which may form a multi-layered edge structure at current layer and eliminate the height differences at specific locations. Therefore, the problem of undesired defects at the wafer edge may be improved, and without performing an additional wafer edge bevel etching process or sacrificing process margins for subsequent planarization process.

Figure 1:
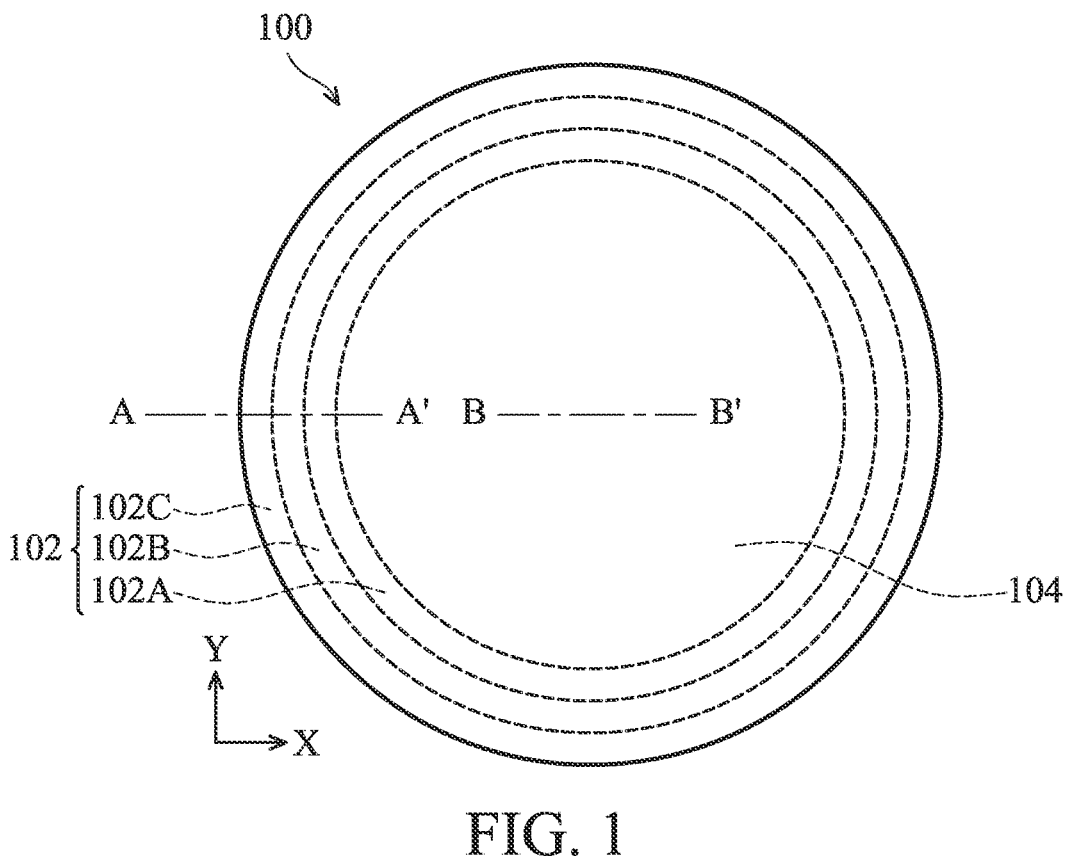
FIG. 1 illustrates a top view of the wafer according to the embodiment of the present disclosure.
Figures 2A, 2B:
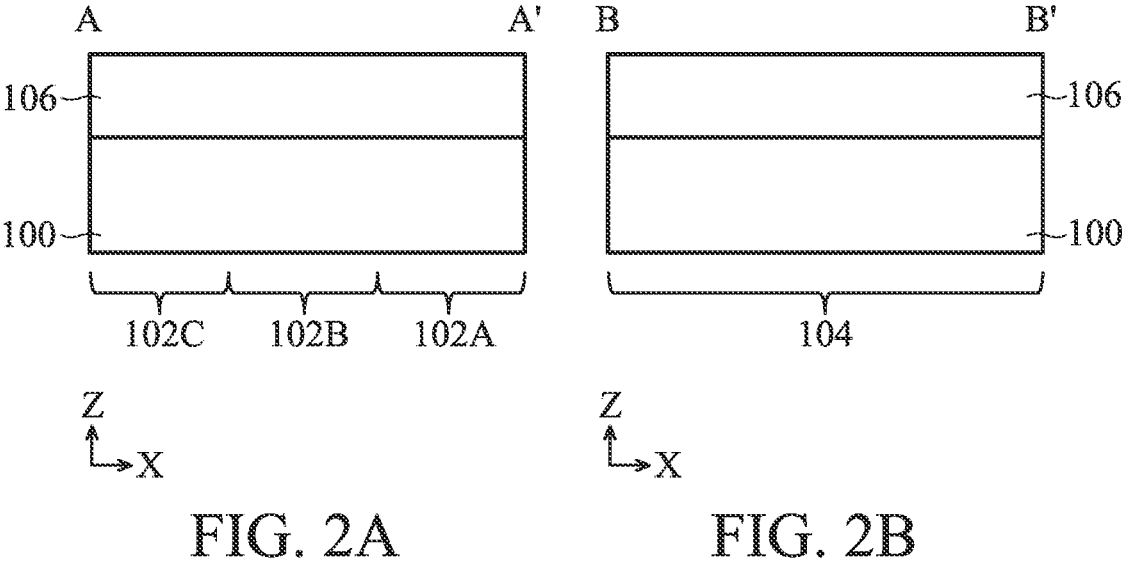

FIG. 1 illustrates a top view of the wafer 100. FIGS. 2A and 2B illustrate cross-sectional views along a line A-A' of an edge region 102 of FIG. 1 and along a line B-B' of a central region 104 of FIG. 1, respectively. The wafer 100 has a central region 104 and an edge region 102. The edge region 102 includes a first edge region 102A surrounding the central region 104, a second edge region 102B surrounding the first edge region 102A, and a third edge region 102C surrounding the second edge region 102B, but the number of the edge regions is not limited to it. Due to the properties of the lithography process, the edge region 102 of the wafer 100 may not be completely exposed, and therefore the edge region 102 is defined as an invalid wafer region. The width of each of the first edge region 102A, the second edge region 102B, and third edge region 102C depends on the process margins of the subsequent wafer edge process. In one embodiment, the width of each of the first edge region 102A, the second edge region 102B, and third edge region 102C is from about 0.5 mm to 1.5 mm. In one embodiment, the width of the edge region 102 is from about 3 mm to 3.5 mm.

Referring to FIGS. 2A and 2B, a hard mask layer 106 is formed on the wafer 100. The hard mask layer 106 may be formed by chemical vapor deposition (CVD) process, atomic layer deposition (ALD) process. The material of the hard mask layer 106 may include silicon oxide formed from tetraethylorthosilicate (TEOS), silicon nitride, or silicon oxynitride.

Figures 3A, 3B, 4A, 4B:
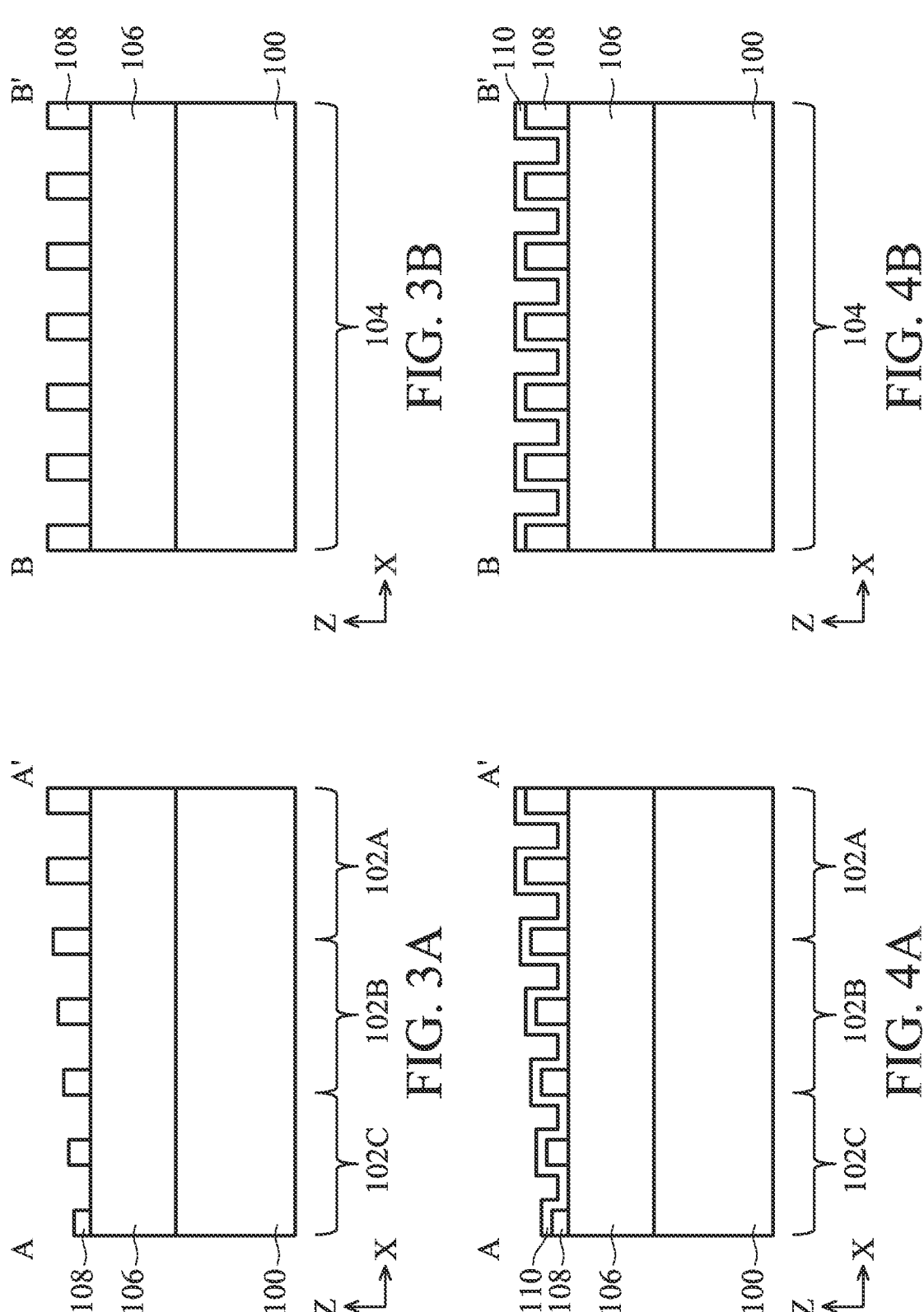

Referring to FIGS. 3A and 3B, a self-alignment double patterning (SADP) process is performed to form a spacer pattern on the hard mask layer 106. In one embodiment, the SADP process includes forming a patterned mandrel 108 on the hard mask layer 106. A spin-on coating process may be performed to form a mandrel layer (not shown) on the hard mask layer 106, and then a lithography process and etching process may be performed to form the patterned mandrel 108. Since the formation of the mandrel layer is affected by the uniformity of deposition of the film, the mandrel layer in the edge region 102 may have an uneven thickness decreasing towards the edges of the wafer 100. As a result, the patterned mandrel 108 in the edge region 102 may also have an uneven height decreasing towards the edge of wafer 100, while the patterned mandrel 108 in the center region 104 has the same height. In other embodiments, a trimming process may additionally be performed on the patterned mandrel 108 to further reduce the dimension of the patterned mandrel 108. In one embodiment, the patterned mandrel 108 may be a single-layered structure or a multi-layered structure, and the material of the patterned mandrel 108 may include carbon, silicon oxynitride, bottom anti-reflective coating (BARC), or a combination thereof.

Referring to FIGS. 4A and 4B, the SADP process further includes conformally forming a spacer material layer 110 on the hard mask layer 106 and the patterned mandrel 108. The spacer material layer 110 may be formed by CVD, ALD, or a combination thereof. The material of the spacer material layer 110 may be an oxide such as silicon oxide.

Referring to FIGS. 5A and 5B, the SADP process further includes performing an etching-back process 112 on the spacer material layer 110 to form a spacer pattern 114 and expose the top surface of the patterned mandrel 108 and the top surface of a portion of the hard mask layer 106. The etching-back process 112 may include an anisotropic etching process (or directional etching process) such as reactive ion etching (RIE) process, plasma etching, inductively coupled plasma (ICP) etching, or dry etching processes of a combination thereof.

Referring to FIGS. 6A and 6B, the SADP process further includes removing the patterned mandrel 108 to remain a spacer pattern 114 on the hard mask layer 106. Since the patterned mandrel 108 has an uneven height in the edge region 102, the spacer pattern 114 originally located on the sidewalls of the patterned mandrel 108 also has an uneven height in the edge region 102. The patterned mandrel 108 may be removed by ashing process, wet etching, dry etching, or a combination thereof.

Figures 7A, 7B:
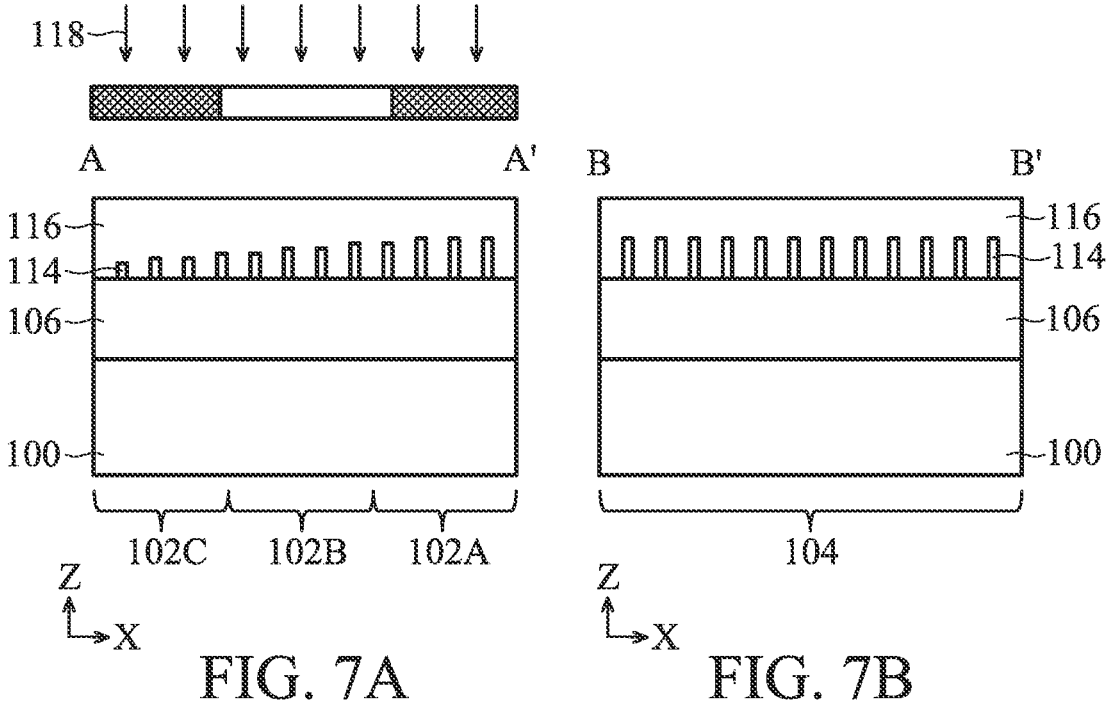

Referring to FIGS. 7A and 7B, a photoresist layer 116 is formed to cover the spacer pattern 114. The photoresist layer 116 may be formed by spin-on coating process. In the present disclosure, the photoresist layer 116 may be a positive photoresist or a negative photoresist. The positive photoresist is defined as the exposed portion is removed after the developing process (i.e., the photoresist becomes soluble after exposure), and the negative photoresist is defined as the exposed portion is remained after the developing process (i.e., the photoresist becomes insoluble after exposure).

Figure 8:
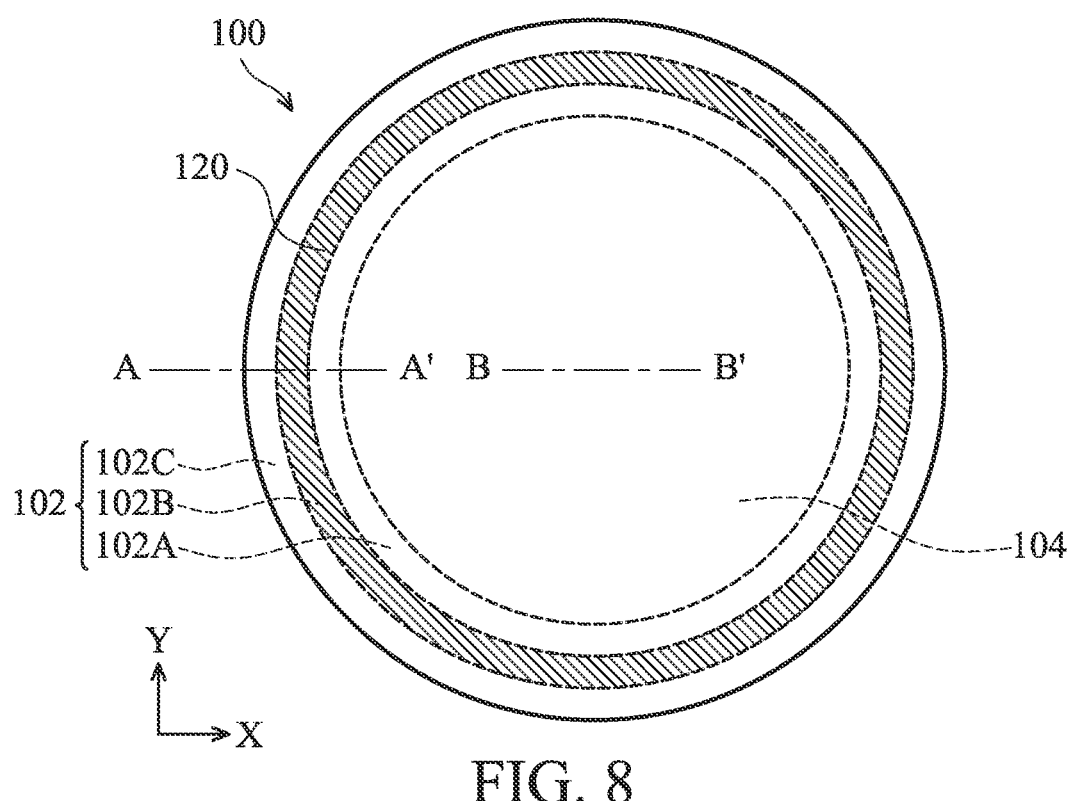
FIG. 8 illustrates a top view of the wafer according to the embodiment of the present disclosure.

Continuing referring to FIGS. 7A, 7B, and 8, a wafer edge treatment process 118 is performed on the photoresist layer 116 to form an annular photoresist pattern 120. In the present disclosure, depending on the uneven height distribution of the spacer pattern 114 in the edge region 102, the annular photoresist pattern 120 may selectively cover the spacer pattern 114 located in at least one of the first edge region 102A, the second edge region 102B, and the third edge region 102C, and expose the spacer pattern 114 located in the central region 104. In some embodiments, the annular photoresist pattern 120 covers the spacer pattern 114 with a relatively low height in the edge region 102 to reduce damage to the edge region 102 from subsequent etching processes. In some embodiments, the annular photoresist pattern 120 is formed on only one of the first edge region 102A, the second edge region 102B, and the third edge region 102C. In other embodiments, the annular photoresist pattern 120 is formed on two adjacent ones or two non-adjacent ones of the first edge region 102A, the second edge region 102B, and the third edge region 102C. In one embodiment, the photoresist layer 116 is a negative photoresist. In the present disclosure, the wafer edge treatment process 118 includes a wafer edge exposure (WEE) process or an edge bead removal (EBR). In one embodiment, the WEE process is performed on the photoresist layer 116 (negative photoresist) on the second edge region 102B to form the annular photoresist pattern 120 covering only the second edge region 102B after the developing process. The photoresist layer 116 (negative photoresist) on the central region 104, the first edge region 102A, and the third edge region 102C is not exposed and is therefore removed after the developing process.

Referring to FIGS. 8, 9A, and 9B, the developing process is performed and the annular photoresist pattern 120 covering the second edge region 102B is remained, while the photoresist layers 116 on the first edge region 102A, the third edge region 102C, and the central region 104 are removed after the developing process.

It should be noted that in other embodiments, the photoresist layer 116 may also be a positive photoresist and may also form the annular photoresist pattern 120 covering only the second edge region 102B, except for the embodiments using the positive photoresist performs a WEE process on the photoresist layer 116 in the first edge region 102A and the third edge region 102C to remain the photoresist layer 116 (positive photoresist) that has not been exposed on the second edge region 102B after the developing process.

Next, referring to FIGS. 8, 10A, and 10B, after forming the annular photoresist pattern 120 over the second edge region 102B, the annular photoresist pattern 120 is used as an etching mask, transferring the exposed spacer pattern 114 to the hard mask layer 106 and the wafer 100 to form a plurality of trenches 126 in the wafer 100. The annular photoresist pattern 120 may protect the spacer pattern 114 that is covered by the annular photoresist pattern 120, so that the subsequent pattern transferring process does not affect the region covered by the annular photoresist pattern 120. In one embodiment, a first etching process 122 is performed to transfer the spacer pattern 114 to the hard mask layer 106. In one embodiment, the first etching process 122 uses the spacer pattern 114 and the annular photoresist pattern 120 as an etching mask to etch the hard mask layer 106 and transfer the exposed spacer pattern 114 to the hard mask layer 106. In one embodiment, the first etching process 122 may include dry etching process, wet etching process, or a combination thereof.

Subsequently, referring to FIGS. 11A and 11B, the annular photoresist pattern 120 and the spacer pattern 114 are removed. In one embodiment, the hard mask layer 106 on the second edge region 102B covered by the annular photoresist pattern 120 is not affected by the first etching process 122, and thus the hard mask layer 106 on the second edge region 102B remains in a mesa-shaped structure after performing the first etching process 122. In one embodiment, the annular photoresist pattern 120 and the spacer pattern 114 may be removed by ashing process, wet etching process, dry etching process, or a combination thereof.

Figures 11A, 11B, 12A, 12B:
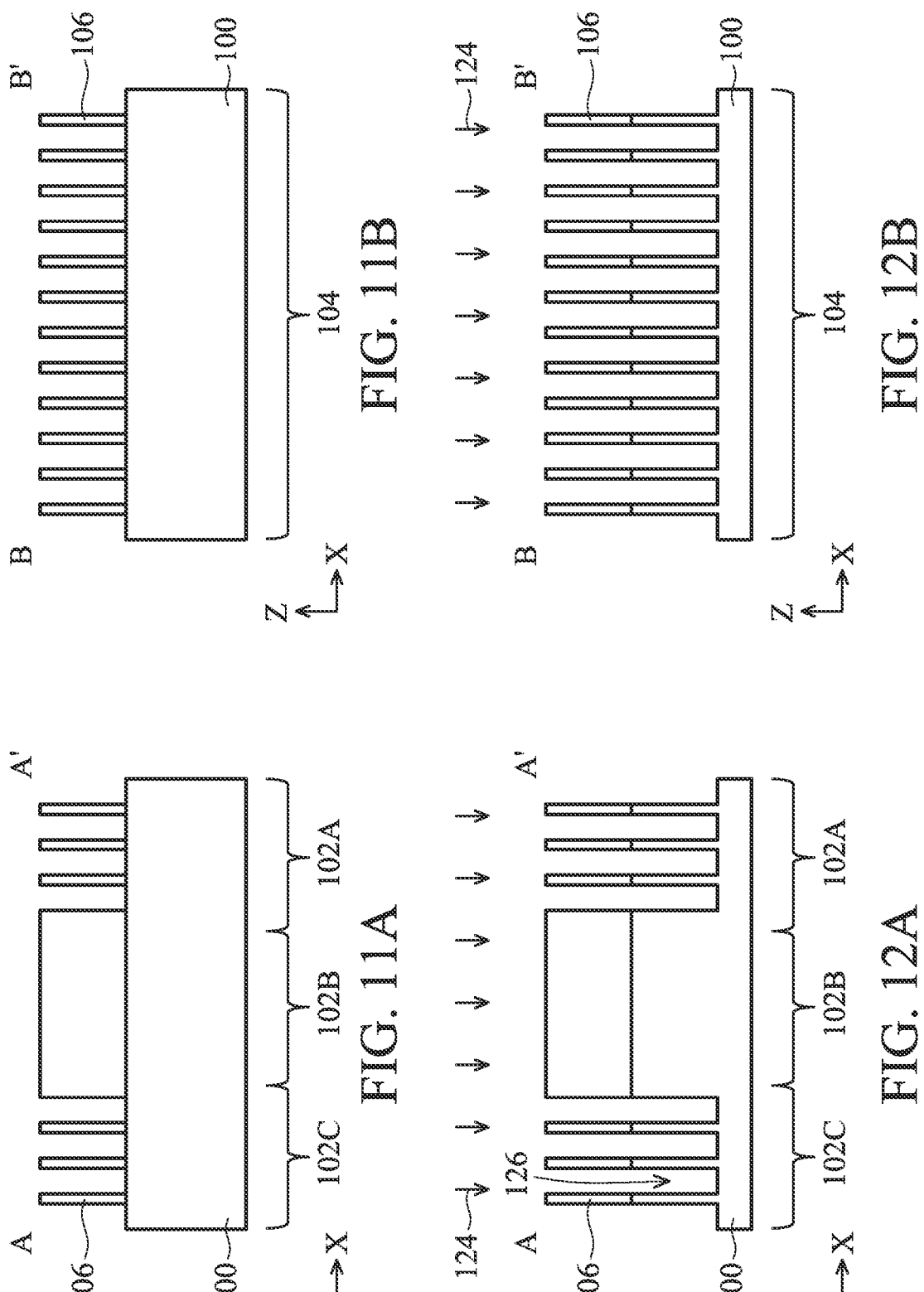

Then, referring to FIGS. 12A and 12B, using the patterned hard mask layer 106 as an etching mask, a second etching process 124 is performed to transfer the pattern of the spacer pattern 114 from the hard mask layer 106 to the wafer 100. In one embodiment, the second etching process 124 may include dry etching process, wet etching process, or a combination thereof.

Next, referring to FIGS. 13A and 13B, a dielectric material layer (not shown) may be formed on the wafer 100 and filling into the trenches 126. A planarization process is then performed on the dielectric material layer to expose the top surface of the hard mask layer 106 on the wafer 100 to form a trench isolation structure 128. It should be noted that a dielectric liner (not shown) may be conformally deposited on the trenches 126 prior to the formation of the dielectric material layer that fills the trenches 126. The dielectric liner may improve the interfacial properties between the substrate of the wafer 100 and the dielectric material layer, and may serve as an etching-stop layer for subsequent planarization process to be performed. In some embodiments, the material of the dielectric liner is silicon oxide, silicon oxynitride, or a combination thereof. The dielectric material layer may be formed by CVD, ALD, spin-on coating process, or other suitable process.

After the formation of the trench isolation structure 128, other semiconductor processes may be performed to form various components, which are not described herein.

In the prior art, in the process of forming the trench isolation structure 128, due to the properties of the lithography process and etching process, a spacer pattern 114 with an uneven distribution of heights is formed in the edge region 102, which prevents the complete formation of the trenches 126 in the edge region 102. For example, an excessively low height of the spacer pattern 114 in the edge region 102 may cause subsequent etching processes to over etch the edge region 102, resulting in the formation of the trenches 126 with a top surface that is lower than the central region 104 or an excessively large opening at the top of the trenches 126. That is, during the deposition process or the etching process for forming the subsequent component, defects such as fragments or particles may easily be generated and released into the central region 104 of the wafer 100, thereby affecting the yield of the product. In the present disclosure, the annular photoresist pattern 120 over the selected edge region 102 is formed to cover the spacer pattern 114 that has an uneven height or is susceptible to over etching due to the etching properties. In this way, over etching of the edge region 102 by subsequent etching processes may be avoided, reducing the possibility of generating defects such as fragments or particles in the invalid wafer region, thereby avoiding the impact on the components in the central region and maintaining the performance of the product.

Figures 15, 17:
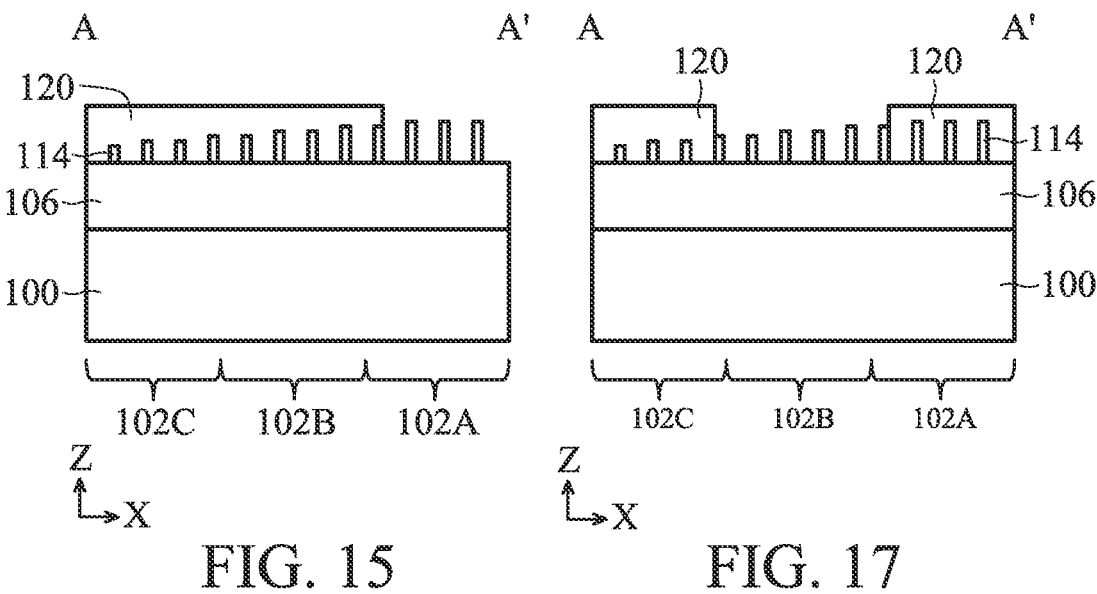
FIG. 15 illustrates a cross-sectional view of the wafer according to another embodiment of the present disclosure.
FIG. 17 illustrates a cross-sectional view of the wafer according to yet another embodiment of the present disclosure.

FIG. 14 illustrates a top view of the wafer 100 after forming the annular photoresist pattern 120 according to another embodiment of the present disclosure. FIG. 15 illustrates a cross-sectional view along the line A-A' of the edge region 102 of FIG. 14. This embodiment is similar to the previous embodiments, except for after performing the WEE process on the photoresist layer 116 (e.g., negative photoresist) over the second edge region 102B and the third edge region 102C, the developing process is performed and the annular photoresist pattern 120 is remained to cover the second edge region 102B and the third edge region 102C. The photoresist layer 116 on the first edge region 102A and the central region 104 is removed after the developing process.

Figure 16:
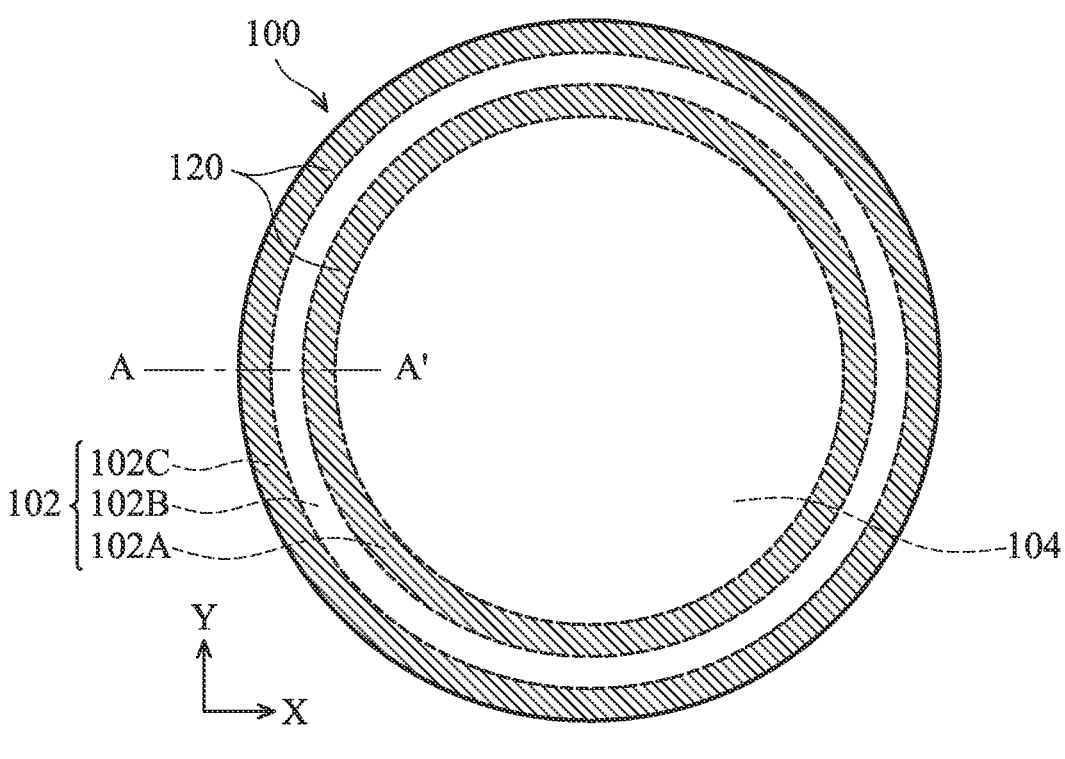
FIG. 16 illustrates a top view of the wafer according to yet another embodiment of the present disclosure.

FIG. 16 illustrates a top view of the wafer 100 after forming the annular photoresist pattern 120 according to yet another embodiment of the present disclosure. FIG. 17 illustrates a cross-sectional view along the line A-A' of the edge region 102 of FIG. 16. This embodiment is similar to the previous embodiments, except for after performing the WEE process on the photoresist layer 116 (e.g., negative photoresist) over the first edge region 102A and the third edge region 102C, the developing process is performed and the annular photoresist pattern 120 is remained to cover the first edge region 102A and the third edge region 102C. The photoresist layer 116 on the second edge region 102B and the central region 104 is removed after the developing process.

Figure 18:
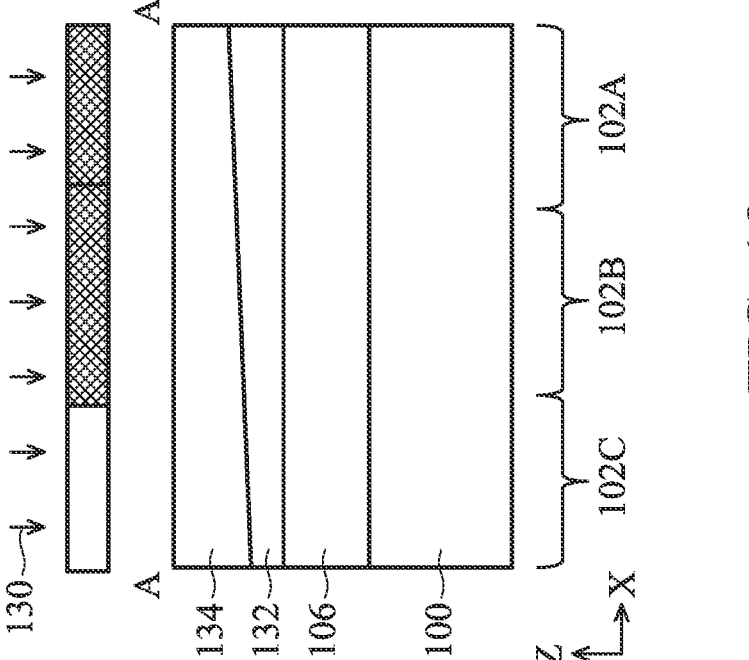

FIGS. 18, 19, 20, and 21 illustrate cross-sectional views along the line A-A' of the edge region 102 of FIG. 1 according to further embodiments of the present disclosure. This embodiment is similar to the previous embodiments, except for during the formation of the patterned mandrel 108 (e.g., the processes described in FIGS. 3A and 3B), another edge treatment process 130 is additionally performed on the edge region 102 in order to avoid the formation of the spacer pattern 114 in the edge region 102. Referring to FIG. 18, similar to the first embodiment described above, in this embodiment, after the hard mask layer 106 is formed, a mandrel layer 132 is formed on the hard mask layer 106 using, for example, a spin-on coating process. Subsequently, another photoresist layer 134 is formed on the mandrel layer 132. In this embodiment, the photoresist layer 134 is a positive photoresist.

Figure 19:
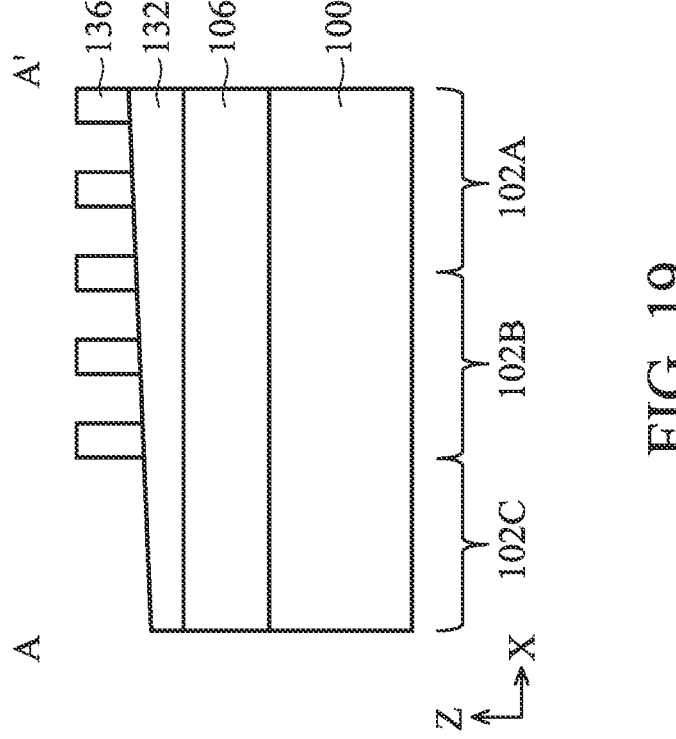
FIGS. 18, 19, 20, and 21 illustrate cross-sectional views of the wafer in various process stages according to further embodiment of the present disclosure.
Figure 21:
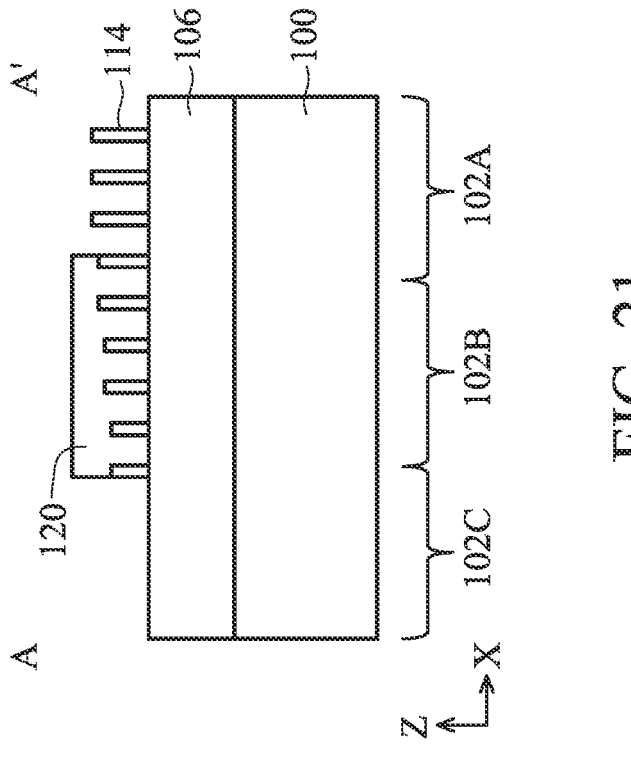
Figure 20:
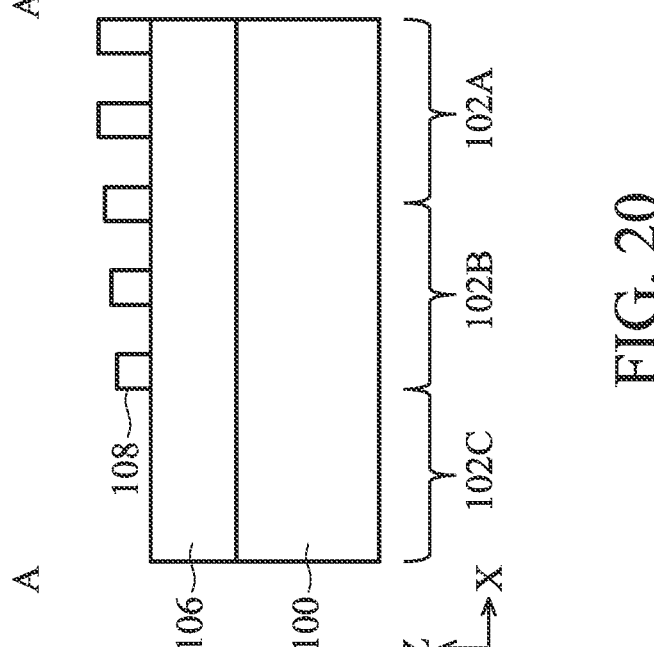

In this embodiment, a wafer edge treatment process 130 (e.g., a WEE process or an EBR process) is performed on the photoresist layer 134 over the third edge region 102C to remove the photoresist layer 134 located over the third edge region 102C, as shown in FIG. 19. Next, the remaining photoresist layer 134 is patterned to form a mandrel photoresist pattern 136 on the mandrel layer 132. Referring to FIG. 20, the mandrel photoresist pattern 136 is transferred to the mandrel layer 132 by an etching process to form the patterned mandrel 108. In this embodiment, the patterned mandrel 108 is formed only over the first edge region 102A, the second edge region 102B, and the central region 104 because the photoresist layer 134 over the third edge region 102C is removed. Referring to FIG. 21, the SADP process as described in the previous embodiments may be performed to form the spacer pattern 114. In this embodiment, the spacer pattern 114 is similarly formed only over the first edge region 102A, the second edge region 102B, and the central region 104. In this embodiment, after forming the spacer pattern 114 on the hard mask layer 106, the process as described in FIGS. 7A to 13A of the previous embodiment may be performed continuously. That is, to form the annular photoresist pattern 120 on the selected edge region 102 and further improve the defect problem of the trenches 126 of the edge region 102, which will not be discussed herein.

It should be noted that although the above embodiments are shown with the formation of the trench isolation structure, the method of the present disclosure may also be applied to other processes that require the formation of a trench structure, such as an inline trench, a buried word line, a trench capacitor, and the like. Thus, although not shown in the figures, various components, such as doped regions, isolated regions, transistors, inline structures, etc., may also be formed on wafer 100 prior to the formation of the hard mask layer 106.

In summary, the present disclosure may effectively improve the incomplete etching or over etching of the trenches formed in wafer edge and reduce the possibility of the formation of the defects such as fragments or particles in the edge region by using the SADP process with the formation of a ring-shaped photoresist pattern. Thus, the various embodiments described herein offer several advantages over the existing art. It will be understood that not all advantages have been necessarily discussed herein, no particular advantage is required for all embodiments, and other embodiments may offer different advantages.

The foregoing outlines features of several embodiments of the present disclosure so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for reducing wafer edge defects, comprising:
    providing a wafer with a central region and an edge region, wherein the edge region comprises a first edge region surrounding the central region, a second edge region surrounding the first edge region, and a third edge region surrounding the second edge region;
    forming a hard mask layer on the wafer;
    forming a spacer pattern on the hard mask layer;
    forming a photoresist layer covering the spacer pattern;
    performing a wafer edge treatment process on the photoresist layer to form an annular photoresist pattern, wherein the annular photoresist pattern selectively covers the spacer pattern located in at least one of the first edge region, the second edge region, and the third edge region and exposes the spacer pattern in the central region; and
    using the annular photoresist pattern as an etching mask, sequentially transferring the exposed spacer pattern to the hard mask layer and the wafer to form a plurality of trenches in the wafer.

2. The method as claimed in claim 1, wherein after forming the hard mask layer, performing a self-alignment double patterning process to form the spacer pattern on the hard mask layer, wherein the self-alignment double patterning process comprises:
    forming a patterned mandrel on the hard mask layer;
    conformally forming a spacer material layer on the hard mask layer and the patterned mandrel;
    etching the spacer material layer to expose a top surface of the patterned mandrel; and
    removing the patterned mandrel to form the spacer pattern.

3. The method as claimed in claim 2, wherein forming the patterned mandrel comprises:
    forming a mandrel layer on the hard mask layer;
    forming another photoresist layer on the mandrel layer;
    performing a wafer edge exposure process or an edge bead removal process on the other photoresist layer to remove the other photoresist layer in the edge region;

patterning the other remaining photoresist layer to form a mandrel photoresist pattern; and
    transferring the mandrel photoresist pattern to the mandrel layer to form the patterned mandrel.

4. The method as claimed in claim 2, wherein a material of the patterned mandrel comprises carbon, silicon nitride, bottom anti-reflective coating, or a combination thereof.

5. The method as claimed in claim 1, wherein the wafer edge treatment process further comprises a wafer edge exposure process or an edge bead removal process.

6. The method as claimed in claim 1, wherein a width of each of the first edge region, the second edge region, and the third edge region is from about 0.5 mm to 1.5 mm.

7. The method as claimed in claim 6, wherein the width of each of the first edge region, the second edge region, and the third edge region is a total of about 3 mm to 3.5 mm.

8. The method as claimed in claim 1, wherein the edge region is an invalid chip region.

9. The method as claimed in claim 1, wherein the photoresist layer comprises a positive photoresist.

10. The method as claimed in claim 1, wherein the photoresist layer comprises a negative photoresist.

11. The method as claimed in claim 1, wherein the annular photoresist pattern is formed on two adjacent ones of the first edge region, the second edge region, and the third edge region.

12. The method as claimed in claim 1, wherein the annular photoresist pattern is formed on two non-adjacent ones of the first edge region, the second edge region, and the third edge region.

13. The method as claimed in claim 1, wherein the annular photoresist pattern is formed on only one of the first edge region, the second edge region, or the third edge region.

14. The method as claimed in claim 1, wherein the spacer pattern has an uneven height in the edge region, and wherein the annular photoresist pattern covers the spacer pattern at a relatively low height in the edge region.

15. The method as claimed in claim 1, wherein the edge region further comprises a fourth edge region surrounding the third edge region, and the annular photoresist pattern covers at least one of the first edge region, the second edge region, the third edge region, and the fourth edge region.

16. The method as claimed in claim 1, wherein after forming the trenches, the method further comprises:
    forming a dielectric material layer on the wafer and filling the trenches with the dielectric material layer; and
    performing a planarization process on the dielectric material layer to expose a top surface of the wafer and to form a trench isolation structure.

17. The method as claimed in claim 1, wherein the sequential transfer of the exposed spacer pattern to the hard mask layer and the wafer further comprises:
    performing a first etching process to transfer the spacer pattern to the hard mask layer;
    removing the annular photoresist pattern and the spacer pattern; and
    using the patterned hard mask layer as an etching mask, and performing a second etching process to transfer the spacer pattern to the wafer.

18. The method as claimed in claim 1, wherein a material of the hard mask layer comprises silicon oxide formed from tetraethylorthosilicate (TEOS), silicon nitride, or silicon oxynitride.

* * * * *